(12) United States Patent
Takasu

(10) Patent No.: US 6,566,721 B2
(45) Date of Patent: May 20, 2003

(54) SEMICONDUCTOR DEVICE

(75) Inventor: Hiroaki Takasu, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/998,815

(22) Filed: Oct. 19, 2001

(65) Prior Publication Data
US 2002/0163047 A1 Nov. 7, 2002

(30) Foreign Application Priority Data
Oct. 24, 2000 (JP) ........................................ 2000-324229

(51) Int. Cl.$^7$ ............................................... H01L 29/76
(52) U.S. Cl. ................. 257/380; 257/379; 257/536; 257/658; 257/359; 257/538; 257/537; 438/382
(58) Field of Search .................. 257/379, 380, 257/536, 658, 359, 538, 537; 438/382

(56) References Cited
U.S. PATENT DOCUMENTS 5,554,873 A * 9/1996 Erdeljac et al. ............. 257/390
5,905,296 A * 5/1999 Tuttle .......................... 257/536
6,441,461 B1 * 8/2002 Takasu ....................... 257/538

* cited by examiner

Primary Examiner—Sara Crane
Assistant Examiner—Junghwa Im
(74) Attorney, Agent, or Firm—Adams & Wilks

(57) ABSTRACT

It is intended to provide a semiconductor device in which a fuse required conventionally is omitted and an initial resistance value can be maintained even under stress imposed due to packaging or the like, a high-accuracy bleeder resistance circuit that can maintain an accurate voltage division ratio, and a high-accuracy semiconductor device with such a bleeder resistance circuit, for example, a voltage detector or a voltage regulator. In a semiconductor device with a resistor, the resistor includes a P-type resistor made of a P-type semiconductor and an N-type resistor made of an N-type semiconductor which are combined to form one body, and the P-type resistor and the N-type resistor are placed on low and high potential sides, respectively. The P-N junction is irradiated with a laser beam or the like, whereby rectification is damaged to allow conduction.

6 Claims, 2 Drawing Sheets

SEMICONDUCTOR DEVICE

BACKGROUND OF THE INVENTION

1. Field of the Invention

The present invention relates generally to a semiconductor device, particularly to a semiconductor device having a resistor, a bleeder resistance circuit with a resistor, and a semiconductor device having the bleeder resistance circuit.

2. Description of the Related Art

Conventionally, many resistors formed of semiconductor thin films made of polysilicon or the like and many bleeder resistance circuits with such resistors have been used, and those formed of either N-type or P-type conductive semiconductor thin films have been known. A method of obtaining a desired voltage division ratio has been known which is achieved by disconnecting a polysilicon fuse through laser trimming to vary the connection of the bleeder resistance circuit. Using them, ICs such as voltage detectors and voltage regulators have been manufactured.

In conventional thin film resistors, however, their resistance values vary when stress is imposed thereon, for instance, when they are subjected to resin packaging. Hence, in a bleeder resistance circuit, the voltage division ratio often varies after resin packaging, which has been a problem. Furthermore, when the conventional laser trimming method is employed, it has been necessary to provide a fuse to enable trimming with a laser beam besides the bleeder resistance circuit.

SUMMARY OF THE INVENTION

The present invention is intended to solve the problem described above. It is an object of the present invention to obtain a high-accuracy bleeder resistance circuit that can maintain an initial resistance value even after being packaged and can maintain an accurate voltage division ratio. It is also an object of the present invention to provide a compact high-accuracy semiconductor device such as a voltage detector or a voltage regulator without using a fuse that has been required conventionally.

A semiconductor device of the present invention employs a first means to achieve the above-mentioned objects. As the first means, resistors and a resistor of the bleeder resistance circuit with the same are formed of a P-type resistor made of a P-type semiconductor and an N-type resistor made of an N-type semiconductor. Furthermore, in the bleeder resistance circuit, a resistance value to be considered as one unit is defined by a resistance value obtained through a combination of the P-type resistor and the N-type resistor. Hence, variations in resistance value of the P-type resistor and the N-type resistor due to a piezoelectric effect are canceled out each other, which is described below.

The following description is directed to the variations in resistance value due to the piezoelectric effect and influences exerted on the bleeder resistance circuit.

When stress is applied to the resistors, the resistance values of the resistors vary due to the so-called "piezoelectric effect". However, in the P-type and N-type resistors, their resistance values vary in the opposite directions to each other. This has been confirmed through experiments conducted by the present inventors. For instance, when the resistance value of the P-type resistor decreases, that of the N-type resistor increases (the direction of the variation changes depending on the direction to which the stress is applied).

When an IC is subjected to resin packaging, stress is caused. Hence, as described above, the resistance values of the resistors vary due to the piezoelectric effect. The bleeder resistance circuit is used for obtaining an accurate voltage division ratio However, the division ratio varies since the resistance values of the respective resistors vary.

The resistor according to the present invention is formed of the P-type resistor made of a P-type semiconductor and the N-type resistor made of an N-type semiconductor. Hence, the variation in resistance value can be prevented even under stress. Furthermore, in the bleeder resistance circuit, the resistance value to be considered as one unit is defined by the resistance value obtained through the combination of the P-type resistor and the N-type resistor. Thus, even under stress, the variations in resistance value of the respective resistors can be canceled out each other, whereby an accurate voltage division ratio can be maintained.

The semiconductor device of the present invention employs a second means to achieve the above-mentioned objects As the second means, P-type resistors and N-type resistors are placed on low and high potential sides, respectively, with current prevented from flowing due to rectification of P-N junctions, and then, the rectification is damaged through irradiation of the P-N junctions of necessary resistors with a laser beam or the like to allow conduction. This permits an omission of a fuse that has been required conventionally.

The resistor of the semiconductor device according to the present invention includes the P-type resistor formed of a P-type semiconductor and the N-type resistor formed of an N-type semiconductor. Hence, even under stress caused by resin packaging or the like, the variations in resistance value of the respective resistors can be canceled out each other and an initial resistance value can be maintained. In the bleeder resistance circuit, the resistance value to be considered as one unit is defined by a resistance value obtained through the combination of the P-type resistor and the N-type resistor. Consequently, an accurate voltage division ratio can be maintained. Furthermore, the P-type resistors and the N-type resistors are placed on low and high potential sides, respectively, and the P-N junctions are irradiated with a laser bean or the like, whereby the rectification is damaged to allow conduction. Thus, a fuse that has been required conventionally can be omitted.

The use of such a bleeder resistance circuit allows a compact high-accuracy semiconductor device, for example, a voltage detector or a voltage regulator, to be obtained.

DETAILED DESCRIPTION OF THE PREFERRED EMBODIMENTS

Preferable embodiments of the present invention will be described hereinbelow with reference to the drawings.

Figure 1:
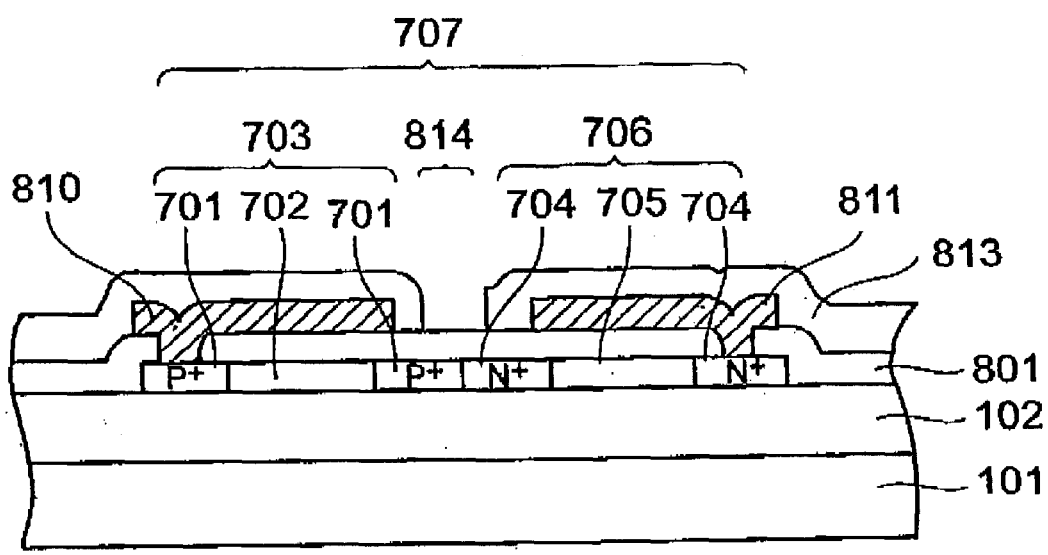
FIG. 1 is a schematic sectional view showing an embodiment of a polysilicon thin film a resistor of a semiconductor device according to the present invention.

FIG. 1 is a schematic sectional view showing an embodiment of a polysilicon thin film resistor of a semiconductor device according to the present invention.

A first insulating film 102 is formed on a semiconductor substrate 101 and a resistor 707 is formed thereon. The resistor 707 is formed of a P-type polysilicon resistor 703 having a P-type high-resistance region 702 sandwiched between P-type low-resistance regions 701 containing dense P-type impurities and an N-type polysilicon resistor 706 having an N-type high-resistance region 705 sandwiched between N-type low-resistance regions 704 containing dense N-type impurities, with one of the P-type low-resistance regions 701 and one of the N-type low-resistance regions 704 being in contact with each other to form one body. A wire 810 made of aluminum is connected to one of the P-type low-resistance regions 701 which is not in contact with the N-type polysilicon resistor 706. Further, a wire 811 made of aluminum is connected to one of the N-type low-resistance regions 704 which is not in contact with the P-type polysilicon resistor 703. In this case, the wires 810 and 811 are connected, for instance, to VSS and VDD sides, respectively, so that the wire 810 is connected to a lower potential than that to which the wire 811 is connected. Furthermore, on the resistor 707, a protective film 813 made of a silicon nitride film or the like is formed in a region except for an area 814 where the one of the P-type low-resistance regions 701 is in contact with the one of the N-type low-resistance regions 704. The area 814 is used to damage the P-N junction through irradiation with a laser beam and thus to eliminate the rectification.

Here, the resistor 707 obtained with the combination of the P-type polysilicon resistor 703 and the N-type polysilicon resistor 706 can maintain its initial resistance value since the variation in resistance of the P-type polysilicon resistor 703 and that of the N-type polysilicon resistor 706 can be canceled out each other even when stress is applied due to resin packaging or the like.

FIG. 1 shows only an example having a combination of one P-type polysilicon resistor 703 and one N-type polysilicon resistor 706. However, the bleeder resistance circuit is formed of a resistor 707 obtained with a combination of a plurality of P-type polysilicon resistors 703 and N-type polysilicon resistors 706.

When the resistor 707 obtained with the combination of the P-type polysilicon resistor 703 and the N-type polysilicon resistor 706 shown in FIG. 1 is defined as one unit of the bleeder circuit and the bleeder circuit as a whole is formed of a plurality of resistors 707, an accurate voltage division ratio can be maintained even when stress is applied due to resin packaging or the like. The use of such a bleeder resistance circuit allows a high-accuracy semiconductor device, for example, a voltage detector or a voltage regulator, to be obtained.

Furthermore, FIG. 1 shows an example with the polysilicon thin film resistor. However, the present invention is not limited to this and can be applied to the cases using for example, a thin single crystal film resistor, a diffused resistor formed in a silicon substrate, or the like as long as it can be formed with P-type and N-type resistors forming one body.

According to the embodiment shown in FIG, 1, laser trimming may be conducted with respect to the resistor 707 to obtain a desired voltage division ratio in the bleeder resistance circuit. Hence, a fuse conventionally required for disconnection with a laser beam is no longer necessary. In the embodiment shown in FIG, 1, the protective film 813 made of a silicon nitride film or the like was formed on the resistor 707 in the region except for the area 814 used to damage the P-N junction through irradiation with a laser beam and thus to eliminate rectification where the one of the P-type low-resistance regions 701 was in contact with the one of the N-type low-resistance regions 704. However, if the P-N junction can be damaged with a laser beam even with the presence of the protective film 813, the protective film 813 also may be formed over the area 814 where the one of the P-type low-resistance regions 701 is in contact with the one of the N-type low-resistance regions 704.

Figure 2:
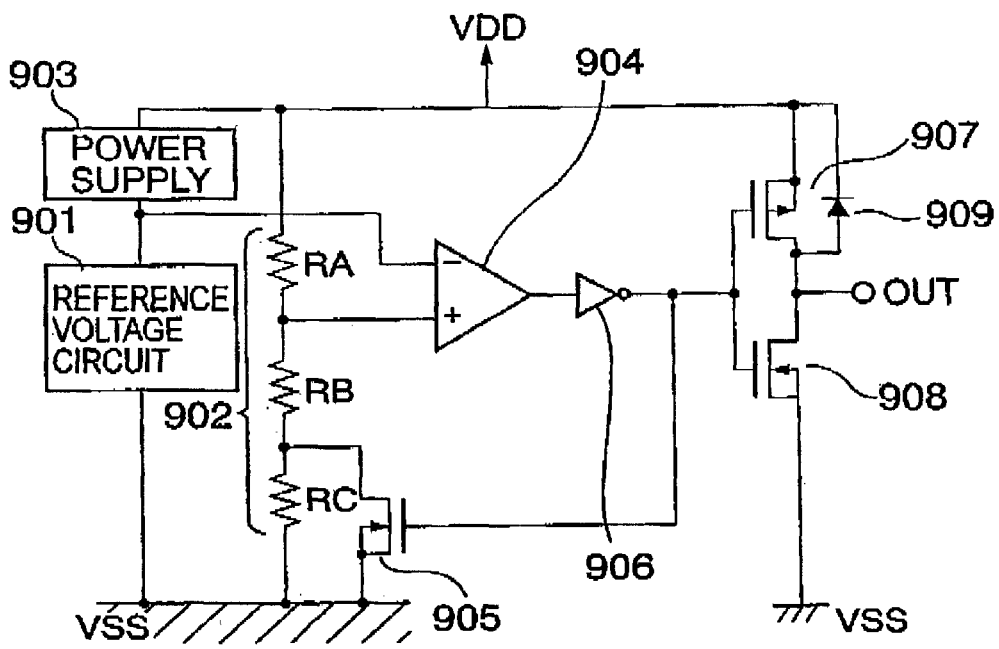
FIG. 2 is a block diagram showing an embodiment of a voltage detector with a bleeder resistance circuit according to the present invention.

FIG. 2 is a block diagram showing an example of a voltage detector with a bleeder resistance circuit according to the present invention.

For convenience, an example of a simple circuit is shown in FIG. 2, but for practical products, additional functions may be provided as required.

The basic circuit structural elements of the voltage detector include a current source 903, a reference voltage circuit 901, a bleeder resistance circuit 902, and an error amplifier 904. In addition, the voltage detector is provided with an inverter 906, N-type transistors 905 and 908, a P-type transistor 907, and the like. Part of its operation is described briefly as follows.

With VDD having a voltage equal to a predetermined canceling voltage or higher, the N-type transistors 905 and 908 turn off and the P-type transistor 907 turns on, whereby VDD is output to an output OUT.

In this case, an input voltage to the error amplifier 904 is (RB+RC)/(RA+RB+RC)*VDD.

When the VDD decreases to a voltage equal to a detecting voltage or lower, VSS is outputted to the output OUT. At this time, the N-type transistor 905 is in the ON state. The input voltage to the error amplifier 904 is RB/(RA+RB)*VDD.

Thus, the basic operation is carried out through the comparison in the error amplifier 904 between a reference voltage generated by the reference voltage circuit 901 and a voltage obtained through voltage division by the bleeder resistance circuit 902. Hence, the accuracy of the voltage obtained through the voltage division by the bleeder resistance circuit 902 is very important. Deteriorated accuracy in the voltage division by the bleeder resistance circuit 902 causes variations in input voltage to the error amplifier 904, whereby the predetermined canceling or detecting voltage cannot be obtained. The use of the bleeder resistance circuit according to the present invention permits highly accurate voltage division even after the IC is packaged with resin. Hence, the yield of the product as an IC can be improved and a voltage detector with higher accuracy can be manufactured.

Figure 3:
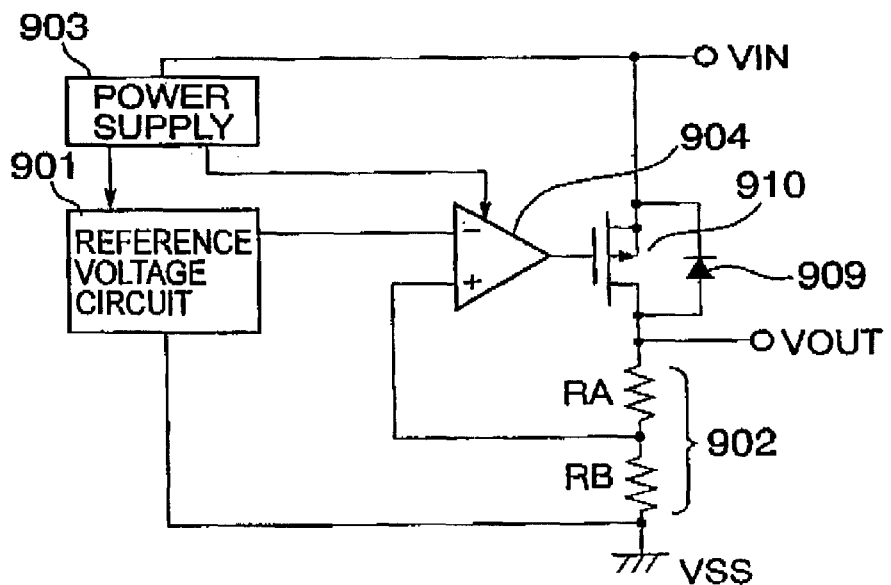
FIG. 3 is a block diagram showing an embodiment of a voltage regulator with the bleeder resistance circuit according to the present invention.

FIG. 3 is a block diagram showing an example of a voltage regulator with a bleeder resistance circuit according to the present invention.

For convenience, an example of a simple circuit is shown in FIG. 3, but for practical products, additional functions may be provided as required.

The basic circuit structural elements of the voltage regulator include a current source 903, a reference voltage circuit 901, a bleeder resistance circuit 902, an error amplifier 904, a P-type transistor 910 serving as a current control transistor, and the like. Part of its operation is described briefly as follows.

The error amplifier 904 compares a voltage obtained through voltage division by the bleeder resistance circuit 902 with a reference voltage generated by the reference voltage circuit 901 and supplies a gate voltage to the P-type transistor 910. The gate voltage is required in order to obtain a constant output voltage VOUT that is not affected by an input voltage VIN and temperature change. Similarly in the voltage regulator, as in the case of the voltage detector described with reference to FIG. 2, its basic operation is carried out through the comparison in the error amplifier 904 between the reference voltage generated by the reference voltage circuit 901 and the voltage obtained through the voltage division by the bleeder resistance circuit 902. Hence, the accuracy of the voltage obtained through the voltage division by the bleeder resistance circuit 902 is very important. Deteriorated accuracy in the voltage division by the bleeder resistance circuit 902 causes variations in input voltage to the error amplifier 904, whereby the predetermined output voltage VOUT cannot be obtained. The use of the bleeder resistance circuit according to the present invention permits highly accurate voltage division even after the IC is packaged with resin. Hence, the yield of the product as an IC can be improved and a voltage regulator with higher accuracy can be manufactured.

As described above, the thin film resistor of the semiconductor device according to the present invention includes the P-type thin film resistor formed of the P-type semiconductor thin film and an N-type thin film resistor formed of the N-type semiconductor thin film. Hence, even when a stress is applied due to resin packaging or the like, variations in resistance value of the respective resistors can be canceled out each other and thus an initial resistance value can be maintained. In the bleeder resistance circuit, the resistance value to be considered as one unit is defined by a resistance value obtained through the combination of the P-type thin film resistor and the N-type thin film resistor. Hence, an accurate voltage division ratio can be maintained. In addition, the P-type and N-type resistors are placed on high and low potential sides, respectively, and the P-N junction is irradiated with a laser beam or the like, so that the rectification is damaged to allow conduction. Consequently, the fuse that has been required conventionally can be omitted.

The use of such a bleeder resistance circuit provides an effect of allowing a compact high-accuracy semiconductor device, for example, a voltage detector or a voltage regulator, to be obtained.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device, comprising a resistor,
   wherein the resistor comprises a P-type resistor made of a P-type semiconductor and an N-type resistor made of an N-type semiconductor which are combined to form one body, the P-type resistor and the N-type resistor are placed on low and high potential sides, respectively, and a P-N junction is irradiated with a laser beam or the like, whereby rectification is damaged to allow conduction.

2. A semiconductor device according to claim 1, wherein the resistor is formed of polysilicon.

3. A semiconductor device according to claim 1, wherein the resistor is formed of a thin single crystal silicon film.

4. A semiconductor device according to claim 1, wherein the resistor is formed of an N-type diffused resistor and a P-type diffused resistor which are provided in a single crystal silicon substrate.

5. A semiconductor device according to claim 1, wherein the semiconductor device is a voltage detector.

6. A semiconductor device according to claim 1, wherein the semiconductor device is a voltage regulator.

* * * * *